US012782629B2

(12) United States Patent
Yen et al.

(10) Patent No.: US 12,782,629 B2
(45) Date of Patent: Nov. 3, 2026

(54) OPTICAL SYSTEM

(71) Applicant: MEGAFORCE COMPANY LIMITED, New Taipei City (TW)

(72) Inventors: Chih-Han Yen, New Taipei City (TW); Han-Chiang Wu, New Taipei City (TW); Ting-Qing Chen, New Taipei City (TW); Yu-Yi Chien, New Taipei City (TW)

(73) Assignee: MEGAFORCE COMPANY LIMITED, New Taipei City (TW)

( * ) Notice: Subject to any disclaimer, the term of this patent is extended or adjusted under 35 U.S.C. 154(b) by 278 days.

(21) Appl. No.: 18/826,348

(22) Filed: Sep. 6, 2024

(65) Prior Publication Data

US 2025/0244546 A1 Jul. 31, 2025

Related U.S. Application Data

(60) Provisional application No. 63/625,403, filed on Jan. 26, 2024.

(30) Foreign Application Priority Data

Jun. 25, 2024 (TW) ................................ 113123500

(51) Int. Cl.

*F21V 8/00* (2006.01)
*G02B 6/10* (2006.01)
(Continued)

(52) U.S. Cl.

CPC ............ *G02B 6/0068* (2013.01); *G02B 6/10* (2013.01); *G02B 6/1228* (2013.01); *G02B 6/125* (2013.01);
(Continued)

(58) Field of Classification Search

CPC .. H01S 5/4093; H01S 5/4012; H01S 5/02255; H01S 5/0225; G02B 6/125;
(Continued)

(56) References Cited

U.S. PATENT DOCUMENTS 5,802,222 A * 9/1998 Rasch ................ G02B 26/0808 385/9
7,346,260 B2 * 3/2008 Arakida ............. G02B 27/0172 385/146
(Continued)

FOREIGN PATENT DOCUMENTS

JP 2005070573 A * 3/2005
JP 2005084227 A * 3/2005 ......... G02B 6/12004
(Continued)

OTHER PUBLICATIONS

JP 7105498 B2 Machine Translation, Jul. 25, 2022. (Year: 2022).*
Kenji et al., Machine Translation of JP 2005-189385 A, Jul. 14, 2005. (Year: 2005).*

*Primary Examiner* — Michelle R Connelly
(74) *Attorney, Agent, or Firm* — Li & Cai Intellectual Property (USA) Office

(57) ABSTRACT

An optical system includes a flexible transmission member and a laser emitting module. The flexible transmission member is a single one-piece structure and includes a first light channel, a second light channel, a third light channel, and a light-combining channel. The second light channel is arranged between the first light channel and the third light channel. The shapes and widths of the first light channel, the second light channel, and the third light channel are different from each other, and the light-combining channel is connected to the first light channel, the second light channel, and the third light channel. The laser emitting module can emit a red light beam, a green light beam, and a blue light beam, which respectively travel in the first light channel, the
(Continued)

second light channel, and the third light channel for being combined into a white light beam in the light-combining channel.

15 Claims, 10 Drawing Sheets

(51) Int. Cl.

| | |
|---|---|
| ***G02B 6/122*** | (2006.01) |
| ***G02B 6/125*** | (2006.01) |
| ***G02B 6/42*** | (2006.01) |
| ***G02B 26/08*** | (2006.01) |
| ***G02B 26/10*** | (2006.01) |
| ***G02B 27/09*** | (2006.01) |
| ***H01S 5/40*** | (2006.01) |

(52) U.S. Cl.

CPC ........ *G02B 26/0833* (2013.01); *H01S 5/4012* (2013.01); *H01S 5/4093* (2013.01); *G02B 6/0073* (2013.01); *G02B 6/4274* (2013.01); *G02B 26/10* (2013.01); *G02B 27/0994* (2013.01)

(58) Field of Classification Search

CPC ........ G02B 6/12007; G02B 6/42; G02B 6/12; G02B 2027/0178; G02B 26/10; G02B 26/0833; G02B 26/101

See application file for complete search history.

(56) References Cited

U.S. PATENT DOCUMENTS

| | | | | |
|---|---|---|---|---|
| 9,240,671 | B2 * | 1/2016 | Ide | H01S 5/02325 |
| 10,185,091 | B2 * | 1/2019 | Katsuyama | H04N 9/3105 |
| 10,408,999 | B2 * | 9/2019 | Katsuyama | G02B 6/124 |
| 10,958,039 | B2 * | 3/2021 | Miyata | G02B 6/42 |
| 11,425,346 | B2 * | 8/2022 | Huebel | H04N 9/3158 |
| 12,181,723 | B2 * | 12/2024 | Itakura | G02B 6/42 |
| 12,259,581 | B2 * | 3/2025 | Fukuzaki | G02B 6/3652 |
| 12,345,913 | B2 * | 7/2025 | Matsunaga | G02B 6/0073 |
| 12,506,319 | B2 * | 12/2025 | Lenef | G02B 27/0172 |
| 2019/0101746 | A1 * | 4/2019 | Katsuyama | G02B 26/085 |
| 2021/0152794 | A1 * | 5/2021 | Yamada | H04N 9/3129 |
| 2022/0299771 | A1 * | 9/2022 | Yamada | G02B 27/0179 |
| 2025/0004221 | A1 * | 1/2025 | Iwabata | G02B 6/122 |

FOREIGN PATENT DOCUMENTS

| | | | | |
|---|---|---|---|---|
| JP | 2005189385 | A * | 7/2005 | |
| JP | 2005266657 | A * | 9/2005 | |
| JP | 2015049318 | A * | 3/2016 | |
| JP | 6535848 | B2 * | 7/2019 | |
| JP | 2020194071 | A * | 12/2020 | |
| JP | 2021131498 | A * | 9/2021 | G02B 26/10 |
| JP | 7105498 | B2 * | 7/2022 | G02B 6/42 |
| JP | 2022143133 | A * | 10/2022 | H01S 5/02325 |
| JP | 2023094645 | A * | 7/2023 | |
| WO | WO-2017090333 | A1 * | 6/2017 | F21S 2/00 |

* cited by examiner

OPTICAL SYSTEM

CROSS-REFERENCE TO RELATED PATENT APPLICATION

This application claims the benefit of priority to Taiwan Patent Application No. 113123500, filed on Jun. 25, 2024. The entire content of the above identified application is incorporated herein by reference.

This application claims the benefit of priority to the U.S. Provisional Patent Application Ser. No. 63/625,403, filed on Jan. 26, 2024, which application is incorporated herein by reference in its entirety.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to an optical system, and more particularly to an optical system that is capable of combining light beams to form a white light beam.

BACKGROUND OF THE DISCLOSURE

A conventional light-combining assembly includes a plurality of optical components that are spaced apart from each other and that are distributed in a chamber, and air is present in a space between any two of the optical components. Accordingly, the conventional light-combining assembly needs to have a large volume, and when the conventional light-combining assembly is used to perform a light-combining process, a plurality of light beams intersect with each other in an environment with refractive indexes having a large difference therebetween, which can easily affect the efficiency and accuracy of the light-combining process.

SUMMARY OF THE DISCLOSURE

In response to the above-referenced technical inadequacies, the present disclosure provides an optical system for effectively improving on the issues associated with conventional light-combining assemblies.

In order to solve the above-mentioned problems, one of the technical aspects adopted by the present disclosure is to provide an optical system, which includes a flexible carrier, a flexible transmission member, and a laser emitting module. The flexible carrier has a front end surface and a rear end surface that is opposite to the front end surface. An interior of the flexible carrier includes a first groove, a second groove, a third groove, and a light-combining groove. One end of the first groove is arranged on the front end surface. One end of the second groove is arranged on the front end surface. One end of the third groove is arranged on the front end surface. The second groove is located between the first groove and the third groove. One end of the light-combining groove is arranged on the rear end surface, and another end of the light-combining groove is in spatial communication with another end of the first groove, another end of the second groove, and another end of the third groove. The flexible transmission member is a single one-piece structure and is assembled in the interior of the flexible carrier. The flexible transmission member includes a first guiding segment, a second guiding segment, a third guiding segment, and a light-combining segment. The first guiding segment is embedded in the first groove to jointly form a first light channel. The first light channel includes a first front segment, a first middle segment having a curved shape, and a first rear segment having a curved shape that are sequentially arranged from the front end surface. A width of the first front segment is greater than a width of the first middle segment, and the width of the first middle segment is greater than a width of the first rear segment. The second guiding segment is embedded in the second groove to jointly form a second light channel. The second light channel has a uniform width and includes a second front segment, a second middle segment, and a second rear segment that are sequentially arranged from the front end surface. The third guiding segment is embedded in the third groove to jointly form a third light channel. The third light channel includes a third front segment, a third middle segment having a curved shape, and a third rear segment having a curved shape that are sequentially arranged from the front end surface. A width of the third front segment is greater than a width of the third middle segment, but is less than the width of the first front segment and is less than the width of the second light channel. The width of the third middle segment is greater than a width of the third rear segment, but is less than the width of the first middle segment. The width of the third rear segment is less than the width of the first rear segment. The light-combining segment is embedded in the light-combining groove to jointly form a light-combining channel. The light-combining channel is connected to the first rear segment, the second rear segment, and the third rear segment. The laser emitting module is disposed corresponding to the front end surface. The laser emitting module is configured to emit a red light beam traveling in the first light channel, a green light beam traveling in the second light channel, and a blue beam light that travels in the third light channel, thereby enabling the light-combining channel to combine the red light beam, the green light beam, and the blue light beam into a white light beam.

In order to solve the above-mentioned problems, another one of the technical aspects adopted by the present disclosure is to provide an optical system, which includes a flexible carrier and a laser emitting module. An interior of the flexible carrier includes a first groove, a second groove, a third groove, and a light-combining groove. The first groove has a first light channel. The first light channel includes a first front segment, a first middle segment having a curved shape, and a first rear segment having a curved shape that are sequentially arranged. A width of the first front segment is greater than a width of the first middle segment, and the width of the first middle segment is greater than a width of the first rear segment. The second groove has a second light channel. The second light channel has a uniform width and includes a second front segment, a second middle segment, and a second rear segment that are sequentially arranged. The third groove has a third light channel. The second groove is arranged between the first groove and the third groove. The third light channel includes a third front segment, a third middle segment having a curved shape, and a third rear segment having a curved shape that are sequentially arranged. A width of the third front segment is greater than a width of the third middle segment, but is less than the width of the first front segment and is less than the width of the second light channel. The width of the third middle segment is greater than a width of the third rear segment, but is less than the width of the first middle segment. The width of the third rear segment is less than the width of the first rear segment. The light-combining groove has a light-combining channel. The second light channel is arranged between the first light channel and the third channel. The light-combining channel is connected to the first rear segment, the second rear segment, and the third rear segment. The laser emitting module is configured to emit a red light beam traveling in the first light channel, a green light beam traveling in the second light channel, and a blue beam light that travels in the third light channel, thereby enabling the light-combining channel to combine the red light beam, the green light beam, and the blue light beam into a white light beam.

In order to solve the above-mentioned problems, yet another one of the technical aspects adopted by the present disclosure is to provide an optical system, which includes a flexible transmission member and a laser emitting module. The flexible transmission member is a single one-piece structure and includes a first guiding segment, a second guiding segment, a third guiding segment, and a light-combining segment. The first guiding segment has a first light channel. The first light channel includes a first front segment, a first middle segment having a curved shape, and a first rear segment having a curved shape that are sequentially arranged. A width of the first front segment is greater than a width of the first middle segment, and the width of the first middle segment is greater than a width of the first rear segment. The second guiding segment has a second light channel. The second light channel has a uniform width and includes a second front segment, a second middle segment, and a second rear segment that are sequentially arranged. The third guiding segment has a third light channel. The third light channel includes a third front segment, a third middle segment having a curved shape, and a third rear segment having a curved shape that are sequentially arranged. A width of the third front segment is greater than a width of the third middle segment, but is less than the width of the first front segment and is less than the width of the second light channel. The width of the third middle segment is greater than a width of the third rear segment, but is less than the width of the first middle segment. The width of the third rear segment is less than the width of the first rear segment. The light-combining segment has a light-combining channel. The second light channel is arranged between the first light channel and the third light channel, and wherein the light-combining channel is connected to the first rear segment, the second rear segment, and the third rear segment. The laser emitting module is configured to emit a red light beam traveling in the first light channel, a green light beam traveling in the second light channel, and a blue beam light that travels in the third light channel, thereby enabling the light-combining channel to combine the red light beam, the green light beam, and the blue light beam into a white light beam.

Therefore, the optical system in the present disclosure is provided with at least one of the flexible carrier and the flexible transmission member for forming the first light channel, the second light channel, the third light channel, and the light-combining channel that have specific structural conditions (e.g., the relationships of the widths), thereby effectively allowing the optical system to have a lightweight characteristic and making a light-combining process of the optical system have better efficiency and quality. For example, the white light beam emitted from the light-combining channel has high uniformity.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
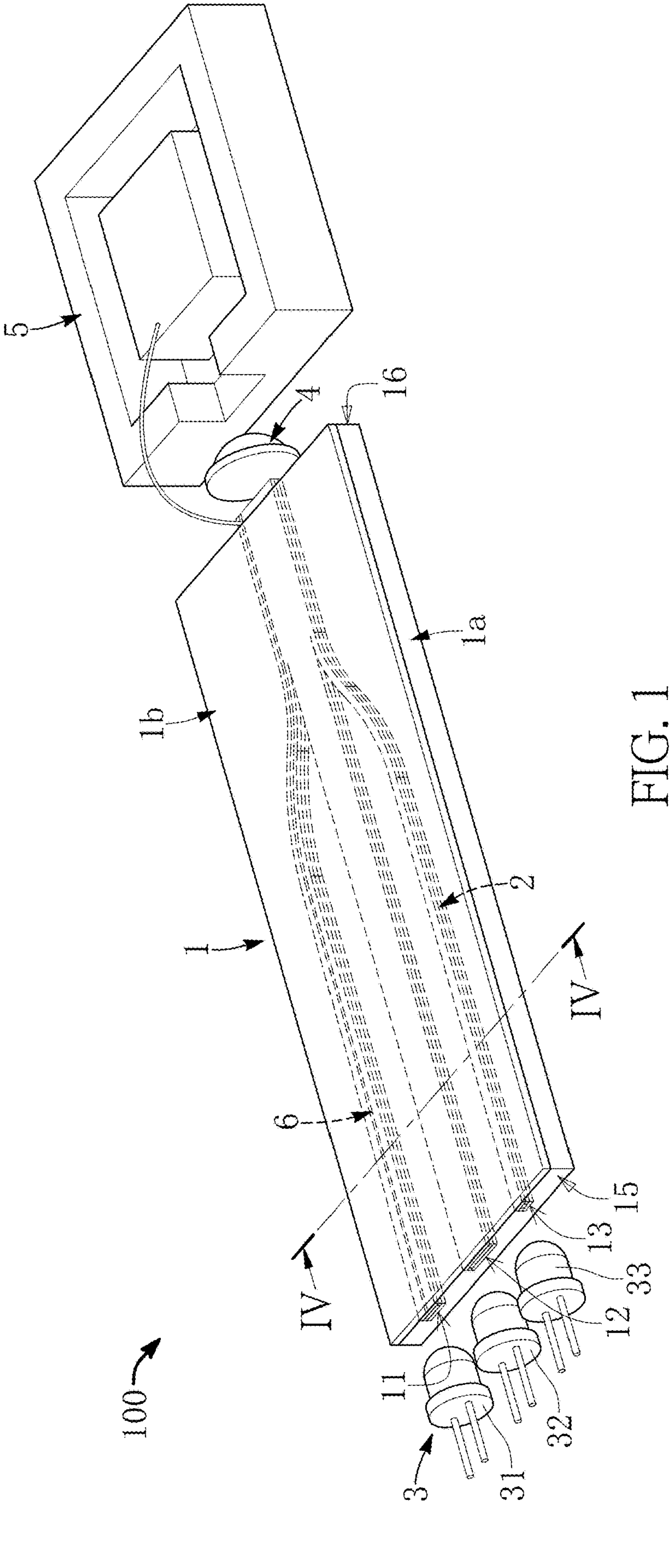
FIG. 1 is a schematic perspective view of an optical system according to a first embodiment of the present disclosure.
Figure 2:
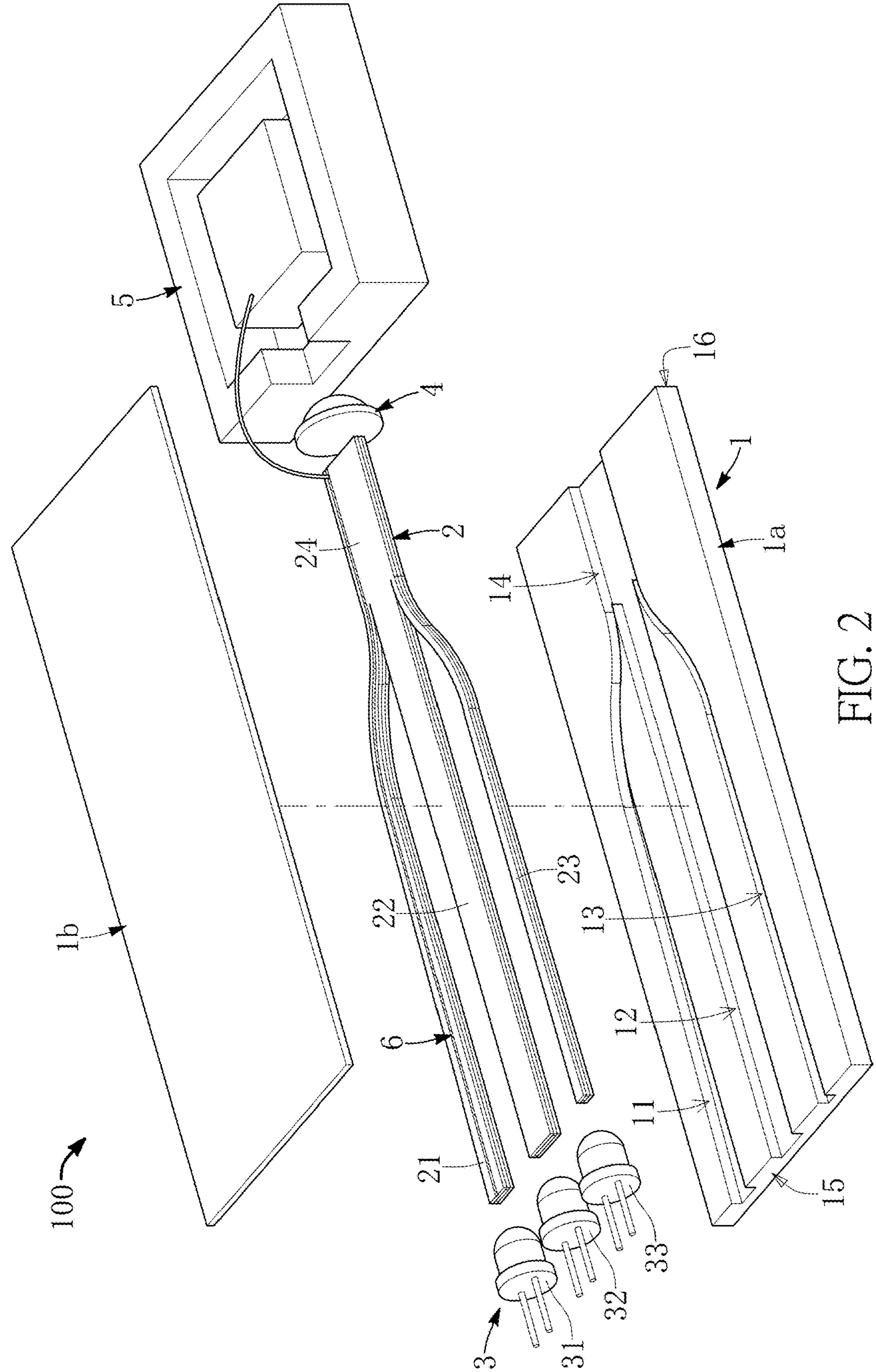
FIG. 2 is a schematic exploded view of FIG. 1.
Figure 3:
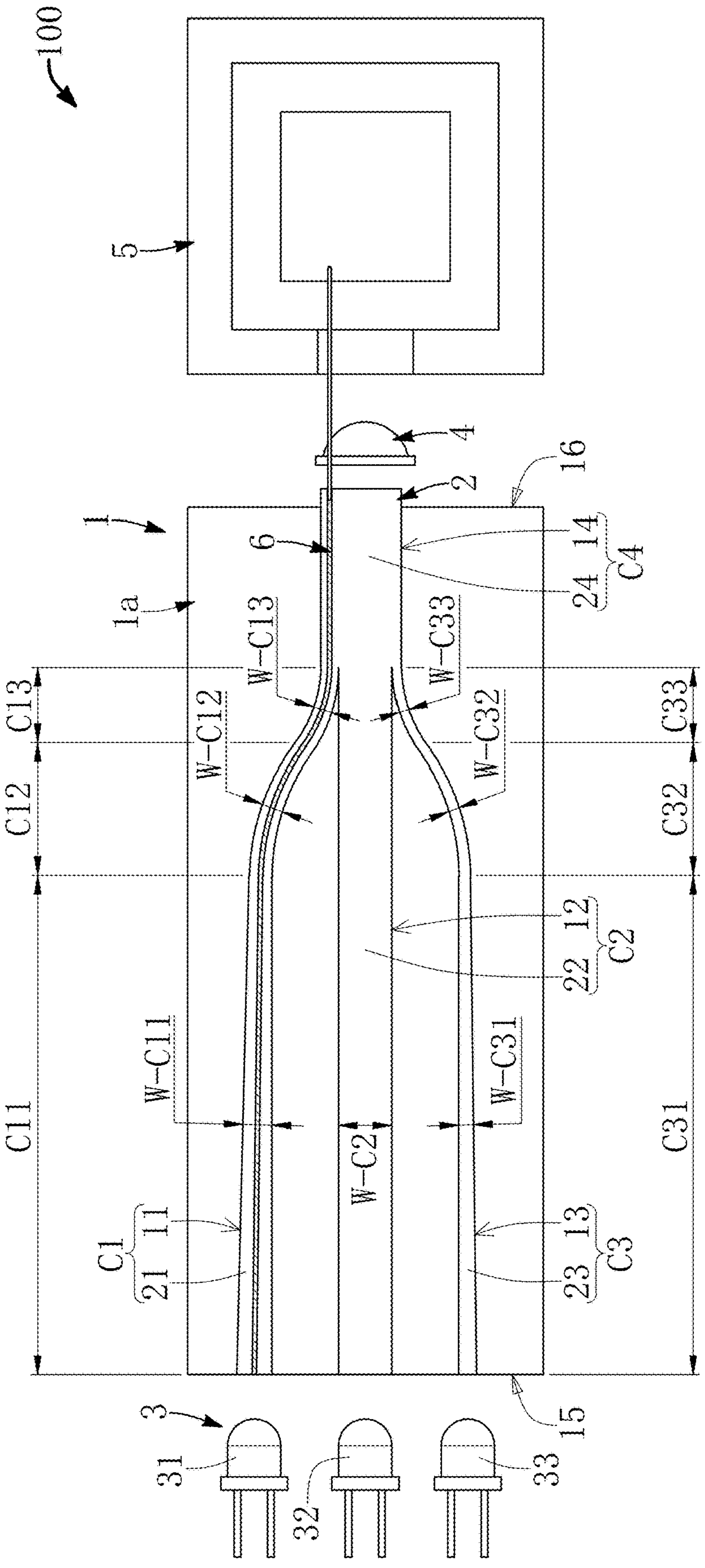
FIG. 3 is a schematic top view of FIG. 1 in which a second board is omitted.
Figure 4:
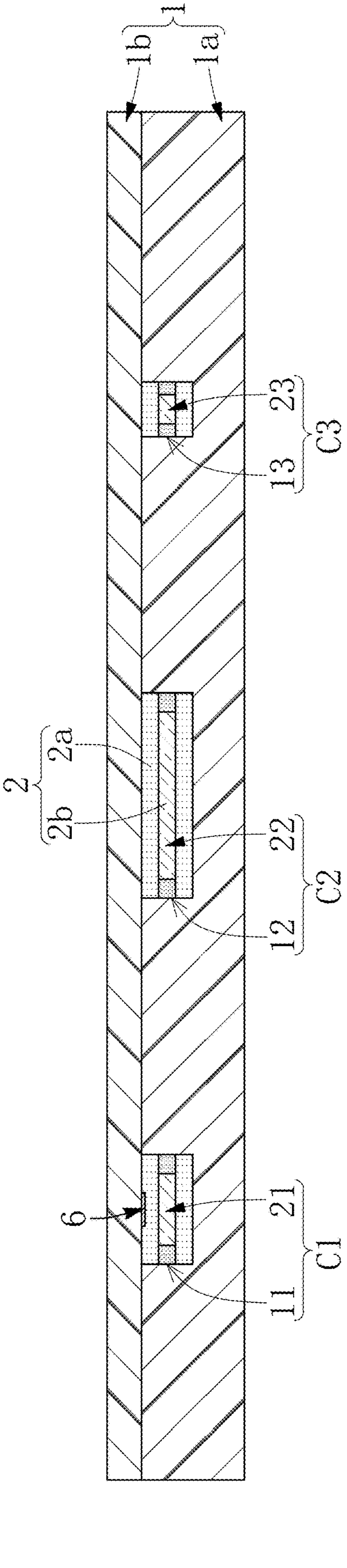
FIG. 4 is a schematic cross-sectional view taken along line IV-IV of FIG. 1.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a," "an" and "the" includes plural reference, and the meaning of "in" includes "in" and "on." Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first," "second" or "third" can be used to describe various components, signals or the like, which are for distinguishing one component/signal from another one only, and are not intended to, nor should be construed to impose any substantive limitations on the components, signals or the like.

First Embodiment

Referring to FIG. 1 to FIG. 4, a first embodiment of the present disclosure is provided. The present embodiment provides an optical system 100, which can be applied to a projection equipment, a lighting equipment, a vehicle-mounted equipment, a head-up display equipment, or an augmented reality (AR) equipment, but the present disclosure is not limited thereto.

The optical system 100 in the present embodiment includes a flexible carrier 1 (e.g., a flexible board 1), a flexible transmission member 2, a laser emitting module 3, a collimating lens 4, a micro electro mechanical systems (MEMS) module 5, and at least one signal transmission circuit 6, but the present disclosure is not limited thereto. For example, in other embodiments of the present disclosure not shown in the drawings, at least one of the collimating lens 4, the MEMS module 5, and the at least one signal transmission circuit 6 in the optical system 100 can be omitted or can be replaced by other components according to practical requirements.

In the present embodiment, the flexible carrier 1 has a front end surface 15 and a rear end surface 16 that is opposite to the front end surface 15, and an interior of the flexible carrier 1 includes a first groove 11, a second groove 12, a third groove 13, and a light-combining groove 14. Moreover, one end of the first groove 11, one end of the second groove 12, and one end of the third groove 13 are arranged on the first end surface 15, and the second groove 12 is arranged between the first groove 11 and the third groove 13.

Furthermore, one end of the light-combining groove 14 is arranged on the rear end surface 16, and another end of the light-combining groove 14 is in spatial communication with another end of the first groove 11, another end of the second groove 12, and another end of the third groove 13. In other words, the first groove 11, the second groove 12, and the third groove 13 are preferably separated from each other, and the first groove 11, the second groove 12, the third groove 13, and the light-combining groove 14 are in spatial communication with an external space only through the front end surface 15 and the rear end surface 16.

It should be noted that the flexible carrier 1 of the present embodiment includes a first board 1*a* and a second board 1*b* that is assembled to the first board 1*a*, and the at least one signal transmission circuit 6 is formed on at least one of the first board 1*a* and the second board 1*b*, but the present disclosure is not limited thereto. For example, in other embodiments of the present disclosure not shown in the drawings, the flexible carrier 1 can be a single one-piece structure according to practical requirements.

Specifically, a thickness of the first board 1*a* in the present embodiment is greater than a thickness of the second board 1*b*, and the first groove 11, the second groove 12, the third groove 13, and the light-combining groove 14 are recessed in the first board 1*a*. Moreover, the second board 1*b* covers (or encloses) the first groove 11, the second groove 12, the third groove 13, and the light-combining groove 14, such that the first groove 11, the second groove 12, and the third groove 13 are in spatial communication with the external space only through the front end surface 15, and the light-combining groove 14 is in spatial communication with the external space only through the rear end surface 16.

The flexible transmission member 2 is a single one-piece structure and is assembled in the interior of the flexible carrier 1. The flexible carrier 1 and the flexible transmission member 2 are bendable for allowing the front end surface 15 and the rear end surface 16 to be moved toward each other. In other words, the bending direction of the flexible carrier 1 and the flexible transmission member 2 preferably allows the front end surface 15 and the rear end surface 16 to be moved toward each other, and does not maintain a fixed relative positioning between the front end surface 15 and the rear end surface 16.

Specifically, the flexible transmission member 2 includes a first guiding segment 21 embedded in the first groove 11, a second guiding segment 22 embedded in the second groove 12, a third guiding segment 23 embedded in the third groove 13, and a light-combining segment 24 that is embedded in the light-combining groove 14.

It should be noted that the flexible transmission member 2 of the present embodiment is a flexible circuit board and includes a plurality of insulating layers 2*a* and a light guiding layer 2*b* that is embedded in the insulating layers 2*a*, and the at least one signal transmission circuit 6 can be formed on one of the insulating layers 2*a*. The light guiding layer 2*b* includes the first guiding segment 21, the second guiding segment 22, the third guiding segment 23, and the light-combining segment 24, but the present disclosure is not limited thereto. For example, in other embodiments of the present disclosure not shown in the drawings, the structure of the flexible transmission member 2 can be similar to a coaxial cable structure or an optical fiber structure.

The first guiding segment 21 and the first groove 11 jointly form (or define) a first light channel C1 that preferably has a functional structure for totally reflecting red light. In the present embodiment, the functional structure of the first light channel C1 for totally reflecting red light can be provided by at least one of the first guiding segment 21 and the first groove 11 or by the cooperation of the first guiding segment 21 and the first groove 11, but the present disclosure is not limited thereto.

Specifically, the first light channel C1 includes a first front segment C11, a first middle segment C12 having a curved shape, and a first rear segment C13 having a curved shape, which are sequentially arranged from the front end surface 15. The first middle segment C12 and the first rear segment C13 have different curvatures. In the present embodiment, the curvatures of the first middle segment C12 and the first rear segment C13 can be opposite to each other, and a length of the first middle segment C12 is slightly greater than a length of the first rear segment C13 and is less than a length of the first front segment C11, but the present disclosure is not limited thereto.

Moreover, a width W-C11 of the first front segment C11 is greater than a width W-C12 of the first middle segment C12, and the width W-C12 of the first middle segment C12 is greater than a width W-C13 of the first rear segment C13. In the present embodiment, a width of the first light channel C1 gradually decreases in a direction from the front end surface 15 toward the light-combining channel C4.

The second guiding segment 22 and the second groove 12 jointly form (or define) a second light channel C2 that preferably has a functional structure for totally reflecting green light. In the present embodiment, the functional structure of the second light channel C2 for totally reflecting green light can be provided by at least one of the second guiding segment 22 and the second groove 12 or by the cooperation of the second guiding segment 22 and the second groove 12, but the present disclosure is not limited thereto.

Specifically, the second light channel C2 has a straight shape and has a uniform width W-C2, and the second light channel C2 includes a second front segment, a second middle segment, and a second rear segment (not labeled in the drawings), which are sequentially arranged from the front end surface 15. The lengths and positions of the second front segment, the second middle segment, and the second rear segment correspond to the lengths and positions of the first front segment C11, the first middle segment C12, and the first rear segment C13.

The third guiding segment 23 and the third groove 13 jointly form (or define) a third light channel C3 that preferably has a functional structure for totally reflecting blue light. In the present embodiment, the functional structure of the third light channel C3 for totally reflecting blue light can be provided by at least one of the third guiding segment 23 and the third groove 13 or by the cooperation of the third guiding segment 23 and the third groove 13, but the present disclosure is not limited thereto.

Specifically, the third light channel C3 includes a third front segment C31, a third middle segment C32 having a curved shape, and a third rear segment C33 having a curved shape, which are sequentially arranged from the front end surface 15. The third middle segment C32 and the third rear segment C33 have different curvatures. In the present embodiment, the curvatures of the third middle segment C32 and the third rear segment C33 can be opposite to each other, and a length of the third middle segment C32 is slightly greater than a length of the third rear segment C33 and is less than a length of the third front segment C31, but the present disclosure is not limited thereto.

Moreover, a width W-C31 of the third front segment C31 is greater than a width W-C32 of the third middle segment C32, and the width W-C32 of the third middle segment C32 is greater than a width W-C33 of the third rear segment C33. In the present embodiment, a width of the third light channel C3 gradually decreases in a direction from the front end surface 15 toward the light-combining channel C4.

In addition, the lengths and positions of the third front segment C31, the third middle segment C32, and the third rear segment C33 correspond to the lengths and positions of the first front segment C11, the first middle segment C12, and the first rear segment C13. The width W-C31 of the third front segment C31 is less than the width W-C11 of the first front segment C11 and is less than the width W-C2 of the second light channel C2, the width W-C32 of the third middle segment C32 is less than the width W-C12 of the first middle segment C12, and the width W-C33 of the third rear segment C33 is less than the width W-C13 of the first rear segment C13. Furthermore, the first front segment C11 of the first light channel C1, the second light channel C2, and the third front segment C31 of the third light channel C3 are substantially parallel to each other.

The light-combining segment 24 and the light-combining groove 14 jointly form (or define) a light-combining channel C4 that is connected to the first rear segment C13, the second rear segment C23, and the third rear segment C33, such that the light-combining channel C4 has a functional structure for combining the red light, the green light, and the blue light into white light. In the present embodiment, the functional structure of the light-combining channel C4 (for combining the red light, the green light, and the blue light into white light) can be provided by at least one of the light-combining segment 24 and the light-combining groove 14 or by the cooperation of the light-combining segment 24 and the light-combining groove 14, but the present disclosure is not limited thereto.

The laser emitting module 3 is disposed corresponding to (e.g., facing toward) the front end surface 15. The laser emitting module 3 is configured to emit a red light beam traveling in the first light channel C1, a green light beam traveling in the second light channel C2, and a blue beam light that travels in the third light channel C3, thereby enabling the light-combining channel C4 to combine the red light beam, the green light beam, and the blue light beam into a white light beam. In the present embodiment, the laser emitting module 3 includes a red-light emitter 31, a green-light emitter 32, and a blue-light emitter 33, but the present disclosure is not limited thereto.

In summary, the optical system 100 in the present embodiment is provided with the flexible carrier 1 and the flexible transmission member 2 for forming the first light channel C1, the second light channel C2, the third light channel C3, and the light-combining channel C4 that have specific structural conditions (e.g., the relationships of the widths), thereby allowing the optical system 100 to have a light-weight characteristic and making a light-combining process of the optical system 100 have better efficiency and quality. For example, the white light beam emitted from the light-combining channel C4 has high uniformity.

In addition, a structure formed by the flexible carrier 1, the flexible transmission member 2, and the laser emitting module 3 can be cooperated with other components according to practical requirements. In order to clearly describe the present embodiment, the structure formed by the flexible carrier 1, the flexible transmission member 2, and the laser emitting module 3 in the following description is cooperated with the collimating lens 4, the MEMS module 5, and the at least one signal transmission circuit 6, but the present disclosure is not limited thereto.

In the present embodiment, the collimating lens 4 is disposed on the rear end surface 16 and that covers the light-combining channel C4 for collimating the white light beam emitted from the light-combining channel C4. The MEMS module 5 is arranged adjacent to the collimating lens 4 for receiving the white light beam. Moreover, the at least one signal transmission circuit 6 is electrically coupled to the laser emitting module 4 and the MEMS module 5 for enabling the MEMS module 5 to output an image.

In addition, each of an inner wall of the first groove 11, an inner wall of the second groove 12, an inner wall of the third groove 13, an inner wall of the light-combining groove 14 is a light reflective surface. Specifically, any one of the light reflective surfaces can be a reflective layer formed (or coated) on a corresponding one of the first groove 11, the second groove 12, the third groove 13, and the light-combining groove 14. Or, the flexible carrier 1 can be made of metal, and any one of the light reflective surfaces is formed by polishing a corresponding one of the first groove 11, the second groove 12, the third groove 13, and the light-combining groove 14.

Second Embodiment

Figure 5:
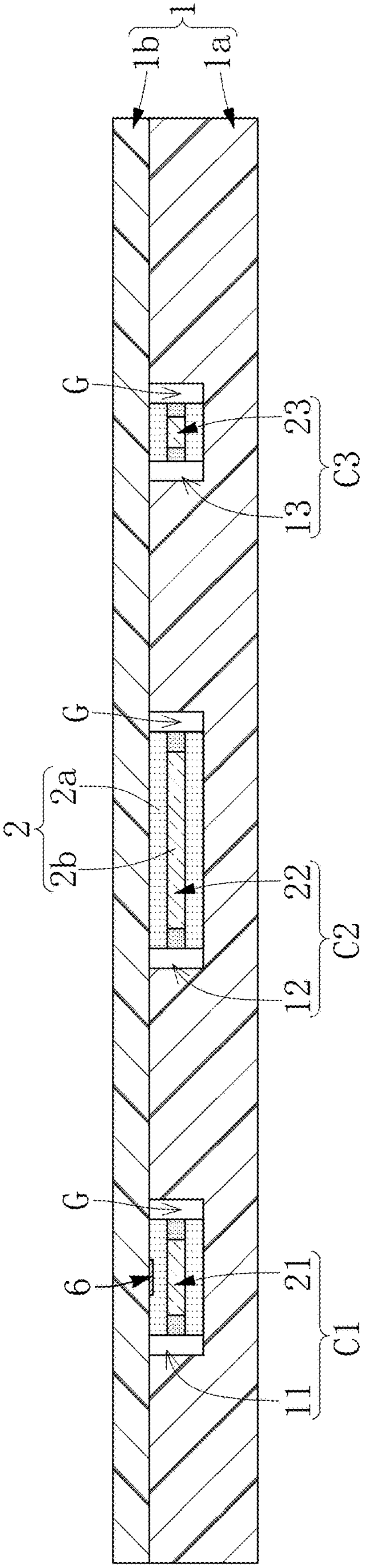
FIG. 5 is a schematic cross-sectional view of the optical system according to a second embodiment of the present disclosure.

Referring to FIG. 5, a second embodiment of the present disclosure, which is similar to the first embodiment of the present disclosure, is provided. For the sake of brevity, descriptions of the same components in the first and second embodiments of the present disclosure will be omitted herein, and the following description only discloses different features between the first and second embodiments.

In the present embodiment, the flexible transmission member 2 and at least one of the inner walls of the flexible carrier 1 have a gap G therebetween, thereby facilitating an assembling of the flexible transmission member 2 and the flexible carrier 1, but the present disclosure is not limited thereto.

Third Embodiment

Figure 6:
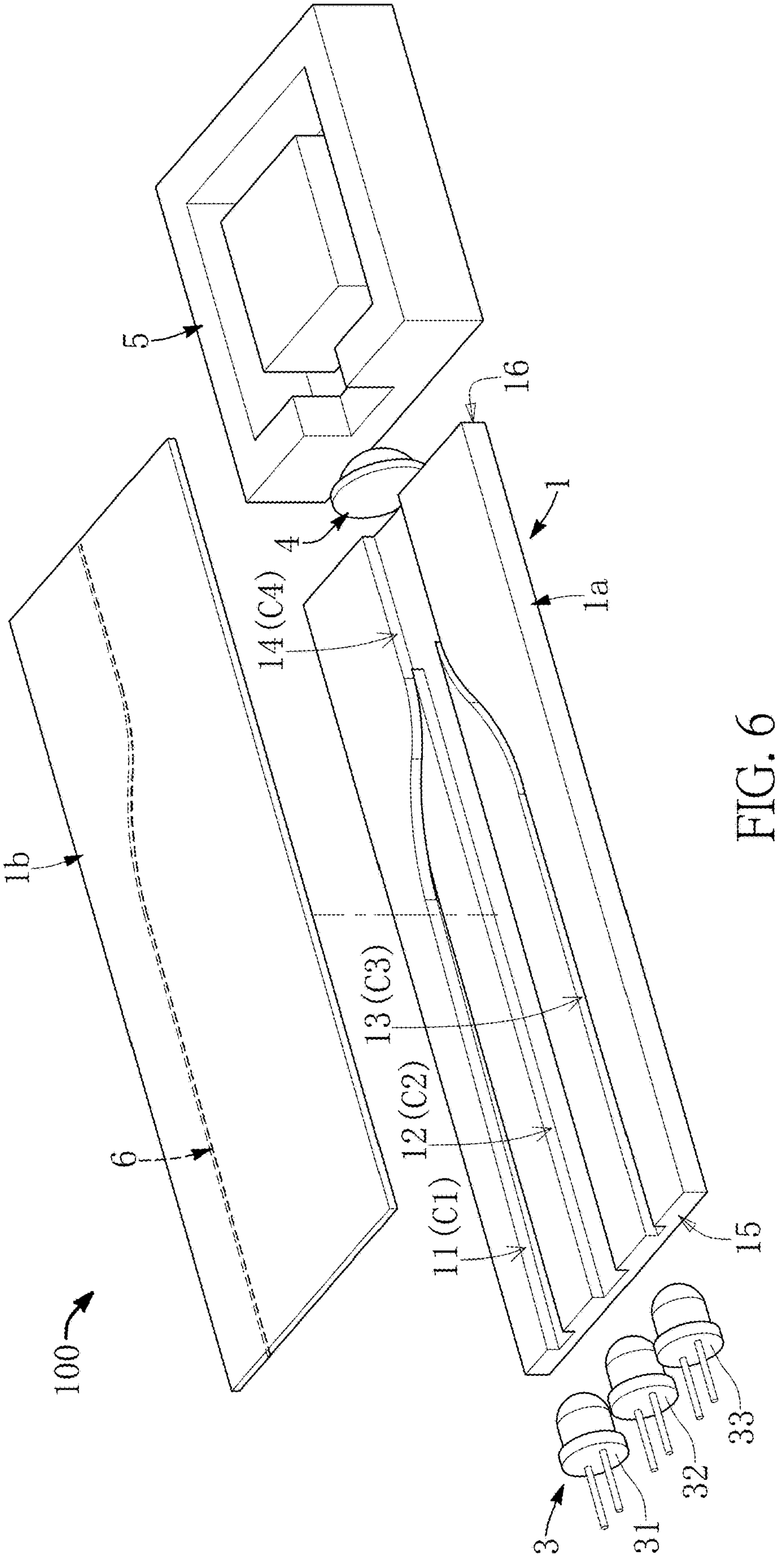
FIG. 6 is a schematic exploded view of the optical system according to a third embodiment of the present disclosure.
Figure 7:
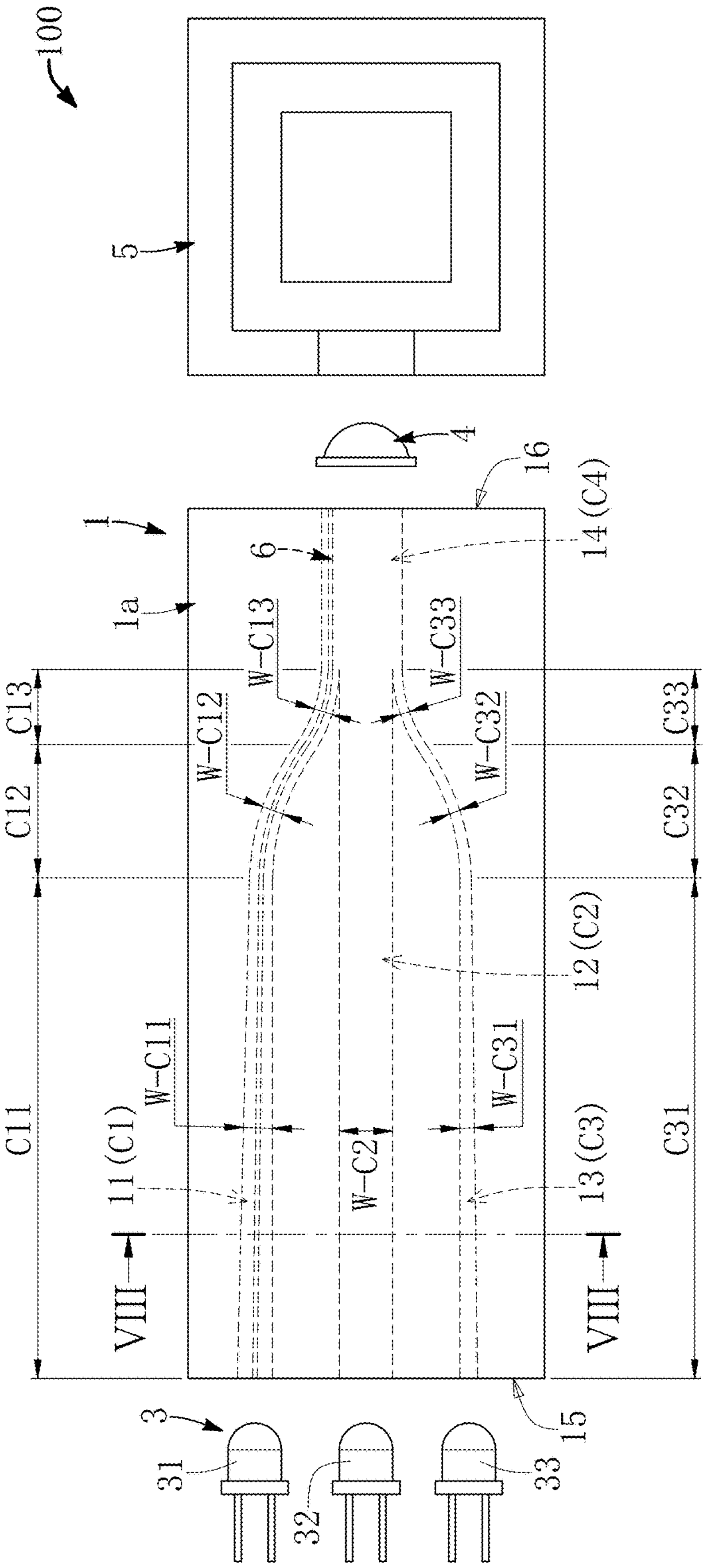
FIG. 7 is a schematic top view of FIG. 6.
Figure 8:
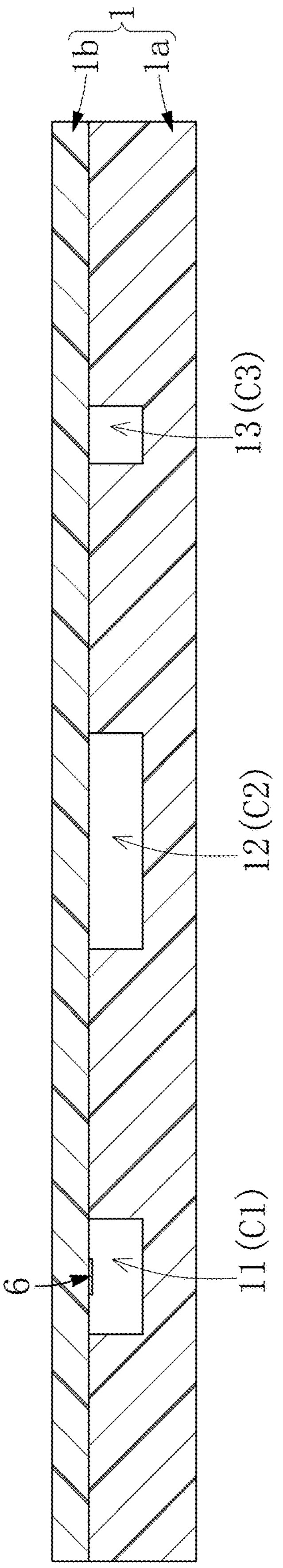
FIG. 8 is a schematic cross-sectional view taken along line VIII-VIII of FIG. 7.

Referring to FIG. 6 to FIG. 8, a third embodiment of the present disclosure, which is similar to the first and second embodiments of the present disclosure, is provided. For the sake of brevity, descriptions of the same components in the first to third embodiments of the present disclosure will be omitted herein, and the following description only discloses different features among the first to third embodiments.

In the present embodiment, the optical system 100 includes a flexible carrier 1 (e.g., a flexible board 1), a laser emitting module 3, a collimating lens 4, a micro electro mechanical systems (MEMS) module 5, and at least one signal transmission circuit 6 (i.e., the optical system 100 of the present embodiment excludes the flexible transmission member 2 disclosed in the first embodiment), but the present disclosure is not limited thereto. For example, in other embodiments of the present disclosure not shown in the drawings, at least one of the collimating lens 4, the MEMS module 5, and the at least one signal transmission circuit 6 in the optical system 100 can be omitted or can be replaced by other components according to practical requirements.

It should be noted that the laser emitting module 3, the collimating lens 4, the MEMS module 5, and the at least one signal transmission circuit 6 provided by the present embodiment are substantially identical to those of the first embodiment and are not described again for the sake of brevity. In other words, the following description focuses on describing the flexible carrier 1 of the present embodiment.

In the present embodiment, the flexible carrier 1 has a front end surface 15 and a rear end surface 16 that is opposite to the front end surface 15, and an interior of the flexible carrier 1 includes a first groove 11, a second groove 12, a third groove 13, and a light-combining groove 14. Moreover, one end of the first groove 11, one end of the second groove 12, and one end of the third groove 13 are arranged on the first end surface 15, and the second groove 12 is arranged between the first groove 11 and the third groove 13.

Furthermore, one end of the light-combining groove 14 is arranged on the rear end surface 16, and another end of the light-combining groove 14 is in spatial communication with another end of the first groove 11, another end of the second groove 12, and another end of the third groove 13. In other words, the first groove 11, the second groove 12, and the third groove 13 are preferably separated from each other, and the first groove 11, the second groove 12, the third groove 13, and the light-combining groove 14 are in spatial communication with an external space only through the front end surface 15 and the rear end surface 16.

It should be noted that the flexible carrier 1 of the present embodiment includes a first board **1*a* and a second board 1*b* that is assembled to the first board 1*a*, and the at least one signal transmission circuit 6 is formed on at least one of the first board 1*a* and the second board 1*b*, but the present disclosure is not limited thereto. For example, in other embodiments of the present disclosure not shown in the drawings, the flexible carrier 1** can be a single one-piece structure according to practical requirements.

Specifically, a thickness of the first board **1*a* in the present embodiment is greater than a thickness of the second board 1*b*, and the first groove 11, the second groove 12, the third groove 13, and the light-combining groove 14 are recessed in the first board 1*a*. Moreover, the second board 1*b* covers (or encloses) the first groove 11, the second groove 12, the third groove 13, and the light-combining groove 14, such that the first groove 11, the second groove 12, and the third groove 13 are in spatial communication with the external space only through the front end surface 15, and the light-combining groove 14 is in spatial communication with the external space only through the rear end surface 16**.

The flexible carrier 1 is bendable for allowing the front end surface 15 and the rear end surface 16 to be moved toward each other. In other words, the bending direction of the flexible carrier 1 preferably allows the front end surface 15 and the rear end surface 16 to be moved toward each other, and does not maintain a fixed relative positioning between the front end surface 15 and the rear end surface 16.

Specifically, the first groove 11 has (or defines) a first light channel C1, the second groove 12 has (or defines) a second light channel C2, the third groove 13 has (or defines) a third light channel C3, and the light-combining groove 14 has (or defines) a light-combining light channel C4. The first light channel C1, the second light channel C2, the third light channel C3, and the light-combining light channel C4 provided by the present embodiment are substantially identical to those of the first embodiment and are not described again for the sake of brevity.

In other words, the first groove 11 can independently provide a functional structure of the first light channel C1 for totally reflecting red light, the second groove 12 can independently provide a functional structure of the second light channel C2 for totally reflecting green light, the third groove 13 can independently provide a functional structure of the third light channel C3 for totally reflecting blue light, and the light-combining groove 14 can independently provide a functional structure of the light-combining channel C4 for combining the red light, the green light, and the blue light into white light.

For example, each of an inner wall of the first groove 11, an inner wall of the second groove 12, an inner wall of the third groove 13, and an inner wall of the light-combining groove 14 in the present embodiment is a light reflective surface, thereby providing the functions of the first light channel C1, the second light channel C2, the third light channel C3, and the light-combining channel C4, but the present disclosure is not limited thereto.

Specifically, any one of the light reflective surfaces can be a reflective layer formed (or coated) on a corresponding one of the first groove 11, the second groove 12, the third groove 13, and the light-combining groove 14. Or, the flexible carrier 1 can be made of metal, and any one of the light reflective surfaces is formed by polishing a corresponding one of the first groove 11, the second groove 12, the third groove 13, and the light-combining groove 14.

Fourth Embodiment

Figure 9:
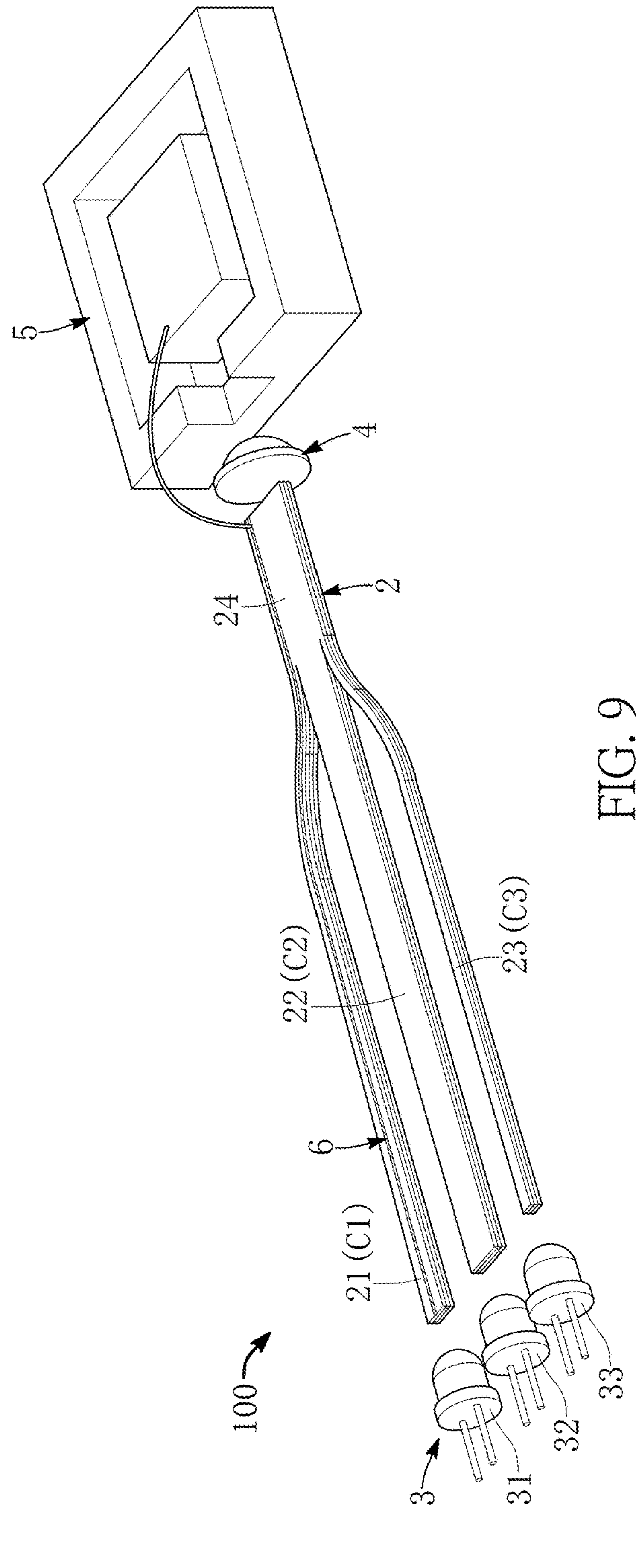
FIG. 9 is a schematic perspective view of the optical system according to a fourth embodiment of the present disclosure.
Figure 10:
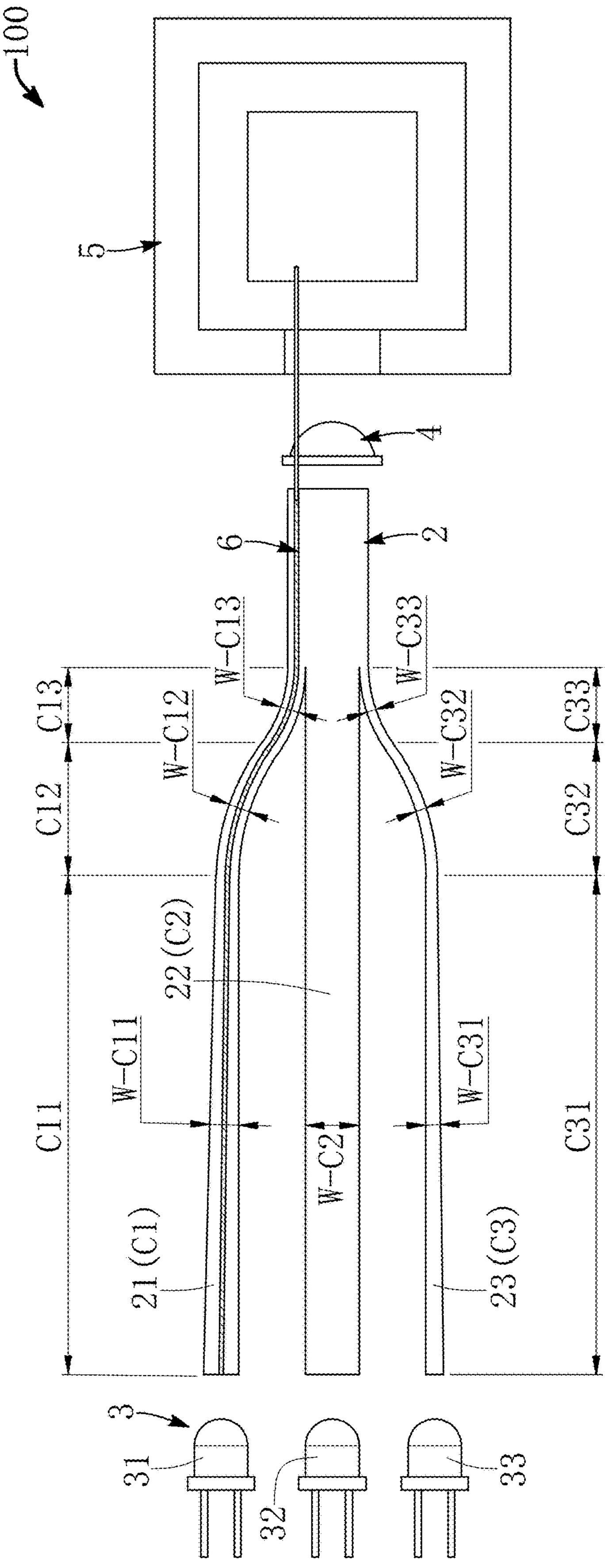
FIG. 10 is a schematic top view of FIG. 9.

Referring to FIG. 9 and FIG. 10, a fourth embodiment of the present disclosure, which is similar to the first and second embodiments of the present disclosure, is provided. For the sake of brevity, descriptions of the same components in the first, second, and fourth embodiments of the present disclosure will be omitted herein, and the following description only discloses different features among the first, second, and fourth embodiments.

In the present embodiment, the optical system 100 includes a flexible transmission member 2, a laser emitting module 3, a collimating lens 4, a micro electro mechanical systems (MEMS) module 5, and at least one signal transmission circuit 6 (i.e., the optical system 100 of the present embodiment excludes the flexible carrier 1 disclosed in the first embodiment), but the present disclosure is not limited thereto. For example, in other embodiments of the present disclosure not shown in the drawings, at least one of the collimating lens 4, the MEMS module 5, and the at least one signal transmission circuit 6 in the optical system 100 can be omitted or can be replaced by other components according to practical requirements.

It should be noted that the laser emitting module 3, the collimating lens 4, the MEMS module 5, and the at least one signal transmission circuit 6 provided by the present embodiment are substantially identical to those of the first embodiment and are not described again for the sake of brevity. In other words, the following description focuses on describing the flexible transmission member 2 of the present embodiment.

In the present embodiment, the flexible transmission member 2 is a single one-piece structure, and the flexible transmission member 2 is bendable for allowing ends thereof to be moved toward each other. In other words, the bending direction of the flexible transmission member 2 preferably allows the ends of the flexible transmission member 2 to be moved toward each other, and does not maintain a fixed relative positioning between the ends of the flexible transmission member 2.

Specifically, the flexible transmission member 2 includes a first guiding segment 21, a second guiding segment 22, a third guiding segment 23, and a light-combining segment 24. The second guiding segment 22 is arranged between the first guiding segment 21 and the third guiding segment 23, and the light-combining segment 24 is connected to ends of the first guiding segment 21, the second guiding segment 22, and the third guiding segment 23 that are adjacent to each other.

It should be noted that the flexible transmission member 2 of the present embodiment is a flexible circuit board and includes a plurality of insulating layers 2*a* and a light guiding layer 2*b* that is embedded in the insulating layers 2*a*, and the at least one signal transmission circuit 6 can be formed on one of the insulating layers 2*a*. The light guiding layer 2*b* includes the first guiding segment 21, the second guiding segment 22, the third guiding segment 23, and the light-combining segment 24, but the present disclosure is not limited thereto. For example, in other embodiments of the present disclosure not shown in the drawings, the structure of the flexible transmission member 2 can be similar to a coaxial cable structure or an optical fiber structure.

Specifically, the first guiding segment 21 has (or defines) a first light channel C1, the second guiding segment 22 has (or defines) a second light channel C2, the third guiding segment 23 has (or defines) a third light channel C3, and the light-combining segment 24 has (or defines) a light-combining light channel C4. The first light channel C1, the second light channel C2, the third light channel C3, and the light-combining light channel C4 provided by the present embodiment are substantially identical to those of the first embodiment and are not described again for the sake of brevity.

In other words, the first guiding segment 21 can independently provide a functional structure of the first light channel C1 for totally reflecting red light, the second guiding segment 22 can independently provide a functional structure of the second light channel C2 for totally reflecting green light, the third guiding segment 23 can independently provide a functional structure of the third light channel C3 for totally reflecting blue light, and the light-combining segment 24 can independently provide a functional structure of the light-combining channel C4 for combining the red light, the green light, and the blue light into white light.

[Beneficial Effects of the Embodiments]

In conclusion, the optical system in the present disclosure is provided with at least one of the flexible carrier and the flexible transmission member for forming the first light channel, the second light channel, the third light channel, and the light-combining channel that have specific structural conditions (e.g., the relationships of the widths), thereby effectively allowing the optical system to have a lightweight characteristic and making a light-combining process of the optical system have better efficiency and quality. For example, the white light beam emitted from the light-combining channel has high uniformity.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An optical system, comprising:

a flexible carrier having a front end surface and a rear end surface that is opposite to the front end surface, wherein an interior of the flexible carrier includes:

- a first groove, wherein one end of the first groove is arranged on the front end surface;
- a second groove, wherein one end of the second groove is arranged on the front end surface;
- a third groove, wherein one end of the third groove is arranged on the front end surface, and the second groove is located between the first groove and the third groove; and
- a light-combining groove, wherein one end of the light-combining groove is arranged on the rear end surface, and another end of the light-combining groove is in spatial communication with another end of the first groove, another end of the second groove, and another end of the third groove;

a flexible transmission member being a single one-piece structure and assembled in the interior of the flexible carrier, the flexible transmission member including:

- a first guiding segment that is embedded in the first groove to jointly form a first light channel, wherein the first light channel includes a first front segment, a first middle segment having a curved shape, and a first rear segment having a curved shape that are sequentially arranged from the front end surface, and wherein a width of the first front segment is greater than a width of the first middle segment, and the width of the first middle segment is greater than a width of the first rear segment;
- a second guiding segment that is embedded in the second groove to jointly form a second light channel, wherein the second light channel has a uniform width and includes a second front segment, a second middle segment, and a second rear segment that are sequentially arranged from the front end surface;

a third guiding segment that is embedded in the third groove to jointly form a third light channel, wherein the third light channel includes a third front segment, a third middle segment having a curved shape, and a third rear segment having a curved shape that are sequentially arranged from the front end surface, and wherein a width of the third front segment is greater than a width of the third middle segment, but is less than the width of the first front segment and is less than the width of the second light channel, wherein the width of the third middle segment is greater than a width of the third rear segment, but is less than the width of the first middle segment, and wherein the width of the third rear segment is less than the width of the first rear segment; and a light-combining segment that is embedded in the light-combining groove to jointly form a light-combining channel, wherein the light-combining channel is connected to the first rear segment, the second rear segment, and the third rear segment; and a laser emitting module disposed corresponding to the front end surface, wherein the laser emitting module is configured to emit a red light beam traveling in the first light channel, a green light beam traveling in the second light channel, and a blue beam light traveling in the third light channel, thereby enabling the light-combining channel to combine the red light beam, the green light beam, and the blue light beam into a white light beam.

2. The optical system according to claim 1, wherein each of a width of the first light channel and a width of the third light channel gradually decreases in a direction from the front end surface toward the light-combining channel.

3. The optical system according to claim 1, wherein the flexible carrier is bendable for allowing the front end surface and the rear end surface to be moved toward each other.

4. The optical system according to claim 1, wherein the first middle segment and the first rear segment of the first light channel have different curvatures, and the third middle segment and the third rear segment of the third light channel have different curvatures.

5. The optical system according to claim 1, wherein the first front segment of the first light channel, the second light channel, and the third front segment of the third light channel are substantially parallel to each other.

6. The optical system according to claim 1, further comprising:

a collimating lens that is disposed on the rear end surface and that covers the light-combining channel for collimating the white light beam emitted from the light-combining channel;

a micro electro mechanical systems (MEMS) module that is arranged adjacent to the collimating lens for receiving the white light beam; and at least one signal transmission circuit that is electrically coupled to the laser emitting module and the MEMS module for enabling the MEMS module to output an image.

7. The optical system according to claim 6, wherein the flexible carrier includes:

a first board, wherein the first groove, the second groove, the third groove, and the light-combining groove are recessed in the first board; and a second board assembled to the first board and covering the first groove, the second groove, the third groove, and the light-combining groove, wherein the at least one signal transmission circuit is formed on the first board or the second board.

8. The optical system according to claim 6, wherein the flexible transmission member is a flexible circuit board and includes:

a plurality of insulating layers, wherein the at least one signal transmission circuit is formed on one of the insulating layers; and a light guiding layer embedded in the insulating layers and including the first guiding segment, the second guiding segment, the third guiding segment, and the light-combining segment.

9. The optical system according to claim 1, wherein each of an inner wall of the first groove, an inner wall of the second groove, an inner wall of the third groove, an inner wall of the light-combining groove is a light reflective surface, and the flexible transmission member and at least one of the inner walls of the flexible carrier have a gap therebetween.

10. An optical system, comprising:

a flexible carrier, wherein an interior of the flexible carrier includes:

a first groove having a first light channel, wherein the first light channel includes a first front segment, a first middle segment having a curved shape, and a first rear segment having a curved shape that are sequentially arranged, and wherein a width of the first front segment is greater than a width of the first middle segment, and the width of the first middle segment is greater than a width of the first rear segment;

a second groove having a second light channel, wherein the second light channel has a uniform width and includes a second front segment, a second middle segment, and a second rear segment that are sequentially arranged;

a third groove having a third light channel, wherein the second groove is arranged between the first groove and the third groove, wherein the third light channel includes a third front segment, a third middle segment having a curved shape, and a third rear segment having a curved shape that are sequentially arranged, and wherein a width of the third front segment is greater than a width of the third middle segment, but is less than the width of the first front segment and is less than the width of the second light channel, wherein the width of the third middle segment is greater than a width of the third rear segment, but is less than the width of the first middle segment, and wherein the width of the third rear segment is less than the width of the first rear segment; and a light-combining groove having a light-combining channel, wherein the second light channel is arranged between the first light channel and the third channel, and wherein the light-combining channel is connected to the first rear segment, the second rear segment, and the third rear segment; and a laser emitting module that is configured to emit a red light beam traveling in the first light channel, a green light beam traveling in the second light channel, and a blue beam light traveling in the third light channel, thereby enabling the light-combining channel to combine the red light beam, the green light beam, and the blue light beam into a white light beam.

11. The optical system according to claim 10, further comprising:

a collimating lens that covers the light-combining channel for collimating the white light beam emitted from the light-combining channel;

a micro electro mechanical systems (MEMS) module that is arranged adjacent to the collimating lens for receiving the white light beam; and at least one signal transmission circuit that is electrically coupled to the laser emitting module and the MEMS module for enabling the MEMS module to output an image.

12. The optical system according to claim 11, wherein the flexible carrier includes:

a first board, wherein the first groove, the second groove, the third groove, and the light-combining groove are recessed in the first board; and a second board assembled to the first board and covering the first groove, the second groove, the third groove, and the light-combining groove, wherein the at least one signal transmission circuit is formed on the first board or the second board.

13. An optical system, comprising:

a flexible transmission member being a single one-piece structure and including:

a first guiding segment having a first light channel, wherein the first light channel includes a first front segment, a first middle segment having a curved shape, and a first rear segment having a curved shape that are sequentially arranged, and wherein a width of the first front segment is greater than a width of the first middle segment, and the width of the first middle segment is greater than a width of the first rear segment;

a second guiding segment having a second light channel, wherein the second light channel has a uniform width and includes a second front segment, a second middle segment, and a second rear segment that are sequentially arranged;

a third guiding segment having a third light channel, wherein the third light channel includes a third front segment, a third middle segment having a curved shape, and a third rear segment having a curved shape that are sequentially arranged, and wherein a width of the third front segment is greater than a width of the third middle segment, but is less than the width of the first front segment and is less than the width of the second light channel, wherein the width of the third middle segment is greater than a width of the third rear segment, but is less than the width of the first middle segment, and wherein the width of the third rear segment is less than the width of the first rear segment; and a light-combining segment having a light-combining channel, wherein the second light channel is arranged between the first light channel and the third light channel, and wherein the light-combining channel is connected to the first rear segment, the second rear segment, and the third rear segment; and a laser emitting module that is configured to emit a red light beam traveling in the first light channel, a green light beam traveling in the second light channel, and a blue beam light traveling in the third light channel, thereby enabling the light-combining channel to combine the red light beam, the green light beam, and the blue light beam into a white light beam.

14. The optical system according to claim 13, further comprising:

a collimating lens that covers the light-combining channel for collimating the white light beam emitted from the light-combining channel;

a micro electro mechanical systems (MEMS) module that is arranged adjacent to the collimating lens for receiving the white light beam; and at least one signal transmission circuit that is electrically coupled to the laser emitting module and the MEMS module for enabling the MEMS module to output an image.

15. The optical system according to claim 14, wherein the flexible transmission member is a flexible circuit board and includes:

a plurality of insulating layers, wherein the at least one signal transmission circuit is formed on one of the insulating layers; and a light guiding layer embedded in the insulating layers and including the first guiding segment, the second guiding segment, the third guiding segment, and the light-combining segment.

* * * * *